United States Patent
Lee et al.

(10) Patent No.: US 9,558,811 B1
(45) Date of Patent: Jan. 31, 2017

(54) DISTURB-PROOF STATIC RAM CELLS

(71) Applicant: Marvell International Ltd., Hamilton HM (BM)

(72) Inventors: Winston Lee, Palo Alto, CA (US); Donald Lee, Fremont, CA (US); Peter Lee, Pleasanton, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

(21) Appl. No.: 14/831,531

(22) Filed: Aug. 20, 2015

Related U.S. Application Data

(60) Provisional application No. 62/044,829, filed on Sep. 2, 2014.

(51) Int. Cl.
| | |
|---|---|
| G11C 11/00 | (2006.01) |
| G11C 11/419 | (2006.01) |
| G11C 11/412 | (2006.01) |
| G11C 11/413 | (2006.01) |

(52) U.S. Cl.
CPC ........... *G11C 11/419* (2013.01); *G11C 11/412* (2013.01); *G11C 11/413* (2013.01)

(58) Field of Classification Search
CPC ..... G11C 11/412; G11C 11/413; G11C 11/419
USPC ................... 365/154, 156, 230.05, 205
See application file for complete search history.

(56) References Cited

U.S. PATENT DOCUMENTS

| | | | |
|---|---|---|---|
| 2012/0212996 A1* | 8/2012 | Rao | G11C 11/419 365/154 |
| 2016/0064067 A1* | 3/2016 | Mojumder | G11C 11/40 365/154 |
| 2016/0141021 A1* | 5/2016 | Mojumder | G11C 11/419 365/154 |
| 2016/0182023 A1* | 6/2016 | Morris | G11C 11/419 365/156 |

* cited by examiner

*Primary Examiner* — Connie Yoha

(57) ABSTRACT

A circuit includes a latch circuit, a buffer transistor having a control terminal coupled to a first output of the latch, a first write transistor having a conduction terminal coupled to the first output and a control terminal coupled to a first write bitline, and a second write transistor having a conduction terminal coupled to a second output of the latch and a control terminal coupled to a second write bitline. A method of operating a memory cell circuit includes providing a first value on first and second write bitlines when a read operation is performed, and when a write operation is performed, providing first and second values on the first and second write bitlines, respectively, when a first storable value is to be stored, and providing the first and second value on the second and first write bitlines, respectively, when a second storable value is to be stored.

20 Claims, 5 Drawing Sheets

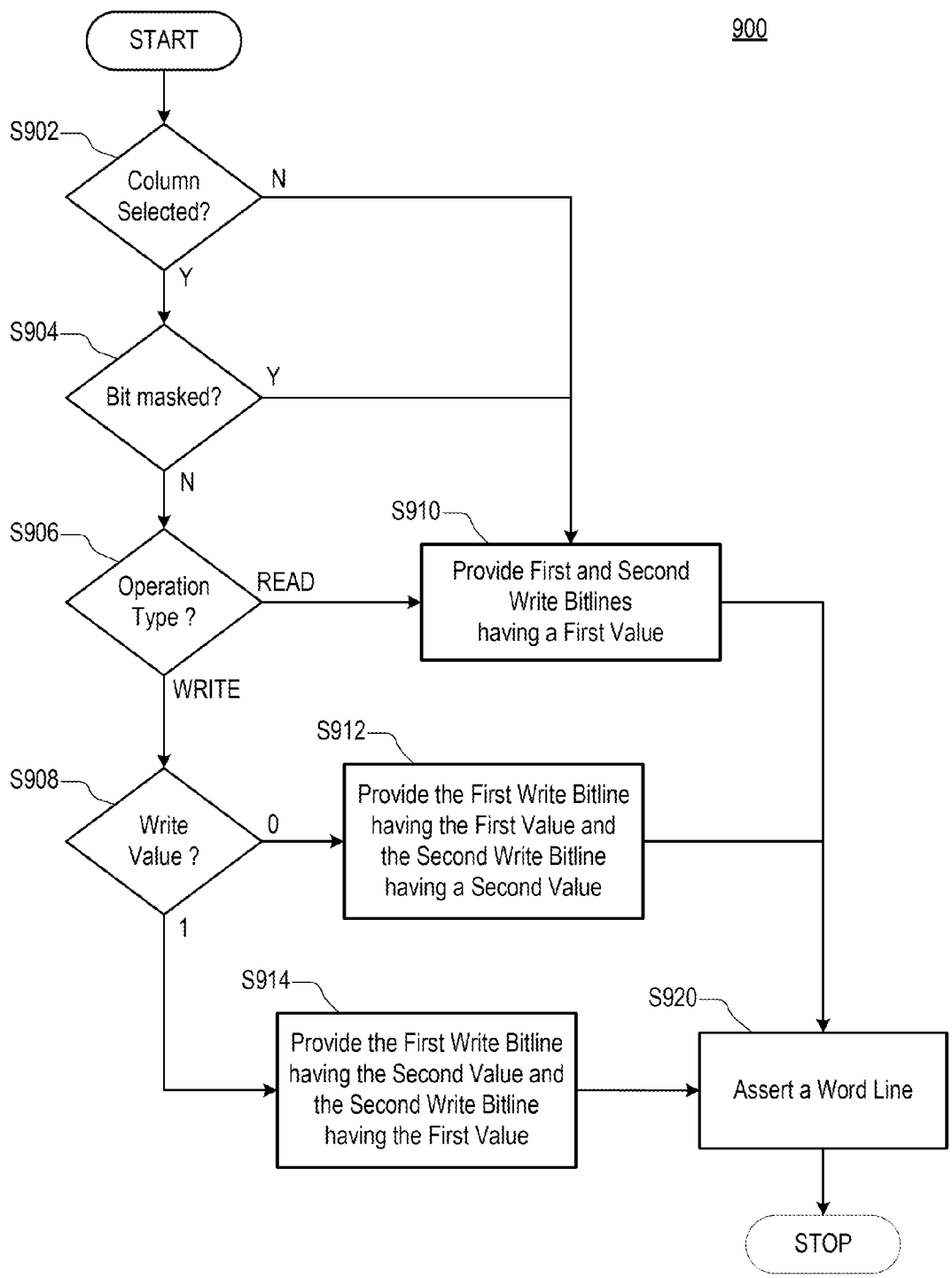

DISTURB-PROOF STATIC RAM CELLS

CROSS REFERENCE TO RELATED APPLICATION

The present disclosure claims the benefit of U.S. Provisional Application No. 62/044,829, filed on Sep. 2, 2014, which is incorporated by reference herein in its entirety.

BACKGROUND

A Static Random Access Memory (SRAM) cell may have reduced performance and reliability because of conflicting current flows to a circuit node of the cell (fighting), and unintended alteration of a data stored in the cell (disturb) during read or write operation. Fighting and disturb may have a more frequent and more detrimental effect as operating voltages of the cell are decreased.

Fighting may occur in the cell when, for example, a p-channel Metal Oxide Semiconductor Field Effect Transistor (pMOSFET) configured to operate as a pull-up transistor sources current into a circuit node at a same time that an n-channel MOSFET (nMOSFET) configured to operate as a pass transistor sinks current from the circuit node. Fighting may decrease the reliability of the cell or increase the time needed to perform write operations to the cell.

Disturb may occur in the cell when a word line connected to the cell has a value that selects the cell, in either read operations (read disturb) or write operations (write disturb). Disturb may be a result of a storage node of the cell being coupled to a low or high voltage on a bit line having a capacitance substantially higher than a capacitance of the storage node of the cell.

SUMMARY

In an embodiment, a circuit includes a latch circuit, a buffer transistor having a control terminal coupled to a first output of the latch, a first write transistor having a conduction terminal coupled to the first output of the latch and a control terminal coupled to a first write bitline, and a second write transistor having a conduction terminal coupled to a second output of the latch and a control terminal coupled to a second write bitline.

In an embodiment, the latch circuit includes a first inverter and a second inverter. The first inverter has an input coupled to the first output of the latch and an output coupled to the second output of the latch. The second inverter has an input coupled to the second output of the latch and an output coupled to the first output of the latch.

In an embodiment, the first inverter includes an enable transistor. A control terminal of the enable transistor is coupled to the first write bitline, and the enable transistor is configured to prevent the first inverter from increasing a voltage value of the second output of the latch when the enable transistor is off.

In an embodiment, the enable transistor is a first enable transistor, and the second inverter includes a second enable transistor. A control terminal of the second enable transistor is coupled to the second write bitline, and the second enable transistor is configured to prevent the second inverter from increasing a voltage value of the first output of the latch when the second enable transistor is off.

In an embodiment, the buffer transistor is a first buffer transistor, and the circuit further includes a second buffer transistor. The second buffer transistor has a control terminal coupled to the second output of the latch.

In an embodiment, a conduction terminal of the buffer transistor is coupled to a read control bitline.

In an embodiment, a conduction terminal of the buffer transistor is coupled to a ground voltage.

In an embodiment, the circuit further includes a select transistor having a control terminal coupled to a word line, a first conduction terminal coupled to a conduction terminal of the buffer transistor, and a second conduction terminal coupled to a bitline.

In an embodiment, the conduction terminals of the first and second write transistors are first conduction terminals, and the circuit further includes first and second write select transistors. Control terminals of the first and second write select transistors are coupled to a write word line. A first conduction terminal of the first write select transistor is coupled to a second conduction terminal of the first write transistor, and a second conduction terminal of the first write select transistor is coupled to the second write bitline. A first conduction terminal of the second write select transistor is coupled to a second conduction terminal of the second write transistor, and a second conduction terminal of the second write select transistor is coupled to the first write bitline.

In an embodiment, the buffer transistor is a first buffer transistor, and the circuit further includes a second buffer transistor. The second buffer transistor has a control terminal coupled to the second output of the latch.

In an embodiment, the buffer transistor and the first and second write transistors each include a Metal-Oxide-Semiconductor Field Effect Transistor (MOSFET).

In an embodiment, the circuit is provided in an integrated circuit.

In an embodiment, a method of operating a memory cell circuit includes providing a first value on first and second write bitlines coupled to the memory cell circuit when a read operation is performed, providing the first value on the first write bitline and a second value on the second write bitline when a write operation is performed and a value to be stored into the memory cell circuit has a first storable value, and providing the second value on the first write bitline and the first value on the second write bitline when the write operation is performed and the value to be stored into the memory cell circuit has a second storable value.

In an embodiment, the method further includes providing the first value on the first and second write bitlines when a column including the memory cell circuit is an unselected column.

In an embodiment, the method further includes providing the first value on the first and second write bitlines when a bit associated with the memory cell circuit is a masked bit.

In an embodiment, the first write bitline is coupled to a control terminal of a first write transistor of the memory cell circuit, and the second write bitline is coupled to a control terminal of a second write transistor of the memory cell circuit.

In an embodiment, the first write bitline is coupled to a control terminal of a first enable transistor of the memory cell, and the second write bitline is coupled to a control terminal of a second enable transistor of the memory cell. The first enable transistor is configured to prevent the latch from increasing a value of a first output of the latch when the first enable transistor is off, and the second enable transistor is configured to prevent the latch from increasing a value of a second output of the latch when the second enable transistor is off.

In an embodiment, the method further includes determining a stored value of memory cell circuit using a read bitline.

The read bitline is coupled to a conduction terminal of a buffer transistor of the memory cell circuit.

In an embodiment, the method further includes providing a first read control value on a read control bitline coupled to a conduction terminal of a buffer transistor of the memory cell circuit when the read operation is performed, and providing a second read control value on the read control bitline when the write operation is performed.

BRIEF DESCRIPTION OF THE DRAWINGS

FIG. 9 illustrates a process of operating a memory cell according to an embodiment.

DETAILED DESCRIPTION

Figure 1:
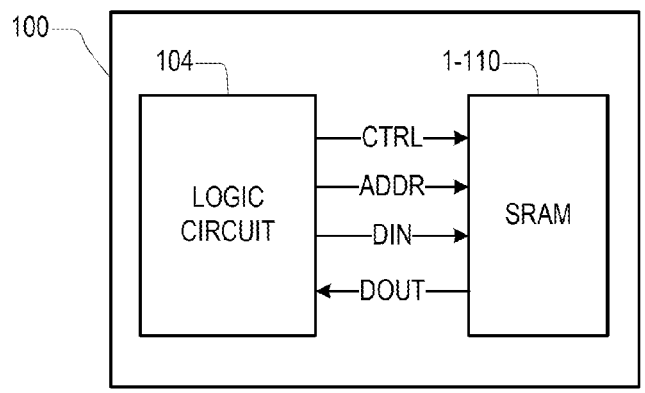
FIG. 1 is a block diagram of an electronic device according to an embodiment.

FIG. 1 is a block diagram of an electronic device 100 according to an embodiment of the present disclosure. The electronic device 100 includes a logic circuit 104 and a Static Random Access Memory (SRAM) 1-110.

The logic circuit 104 may include one or more of a processor, a controller, a finite state machine, an input/output interface, a clock generator, a voltage generator, and the like. The logic circuit 104 provides control signals, address signals, and data in signals CTRL, ADDR, and DIN to the SRAM 1-110, and receives data out signals DOUT from the SRAM 1-110.

When the control signals CTRL indicate a write operation, the SRAM 1-110 stores values transmitted by the logic circuit 104, using the data in signals DIN, according to a value of the address signals ADDR. When the control signals CTRL indicate a read operation, the SRAM 1-110 provides a value to the logic circuit 104, using the data out signals DOUT, according to a value previously stored according to the value of the address signals ADDR.

Figure 2:
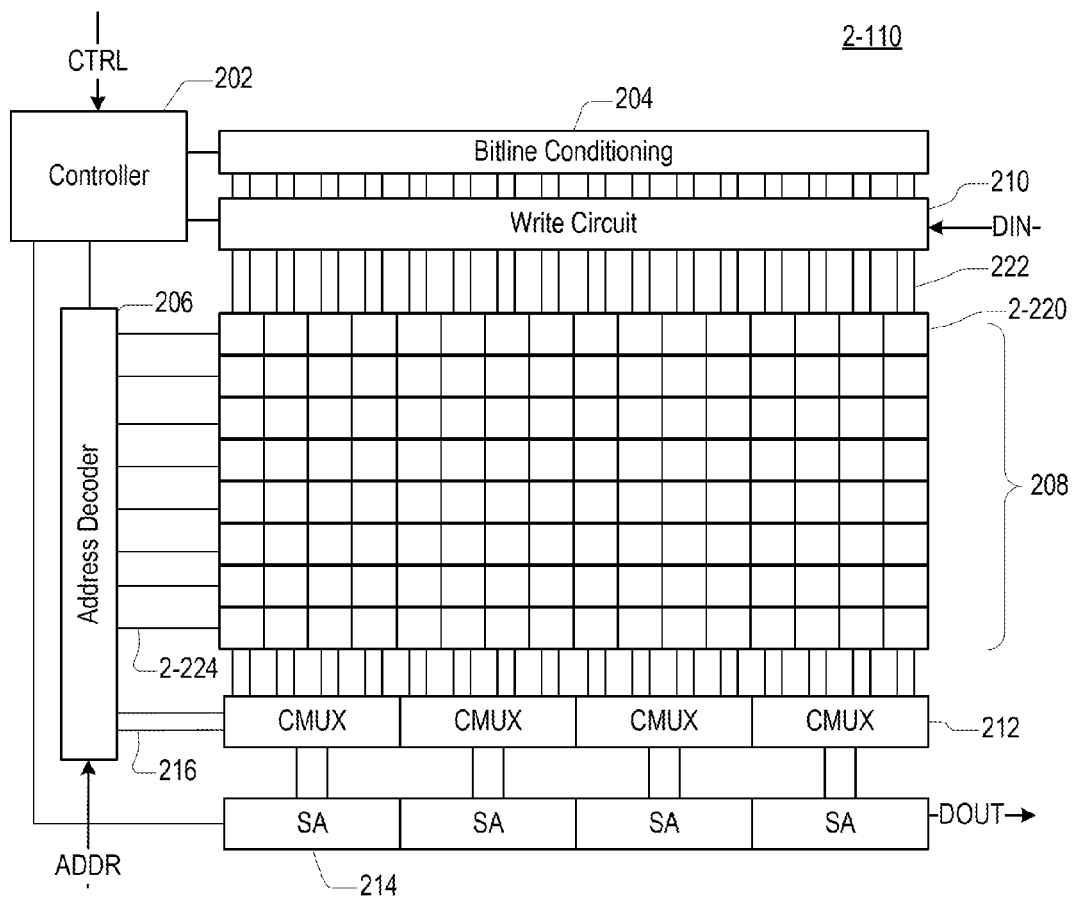
FIG. 2 is a diagram of a Static Random Access Memory (SRAM) according to an embodiment.

FIG. 2 illustrates an SRAM 2-110 according to an embodiment, suitable for use as the SRAM 1-110 of FIG. 1. The SRAM 2-110 includes a controller 202, a bitline conditioning circuit 204, an address decoder 206, a cell array 208, a write circuit 210, a plurality of column muxes 212, and a plurality of sense amplifiers 214.

The controller 202 is configured to control the bitline conditioning circuit 204, the address decoder 206, the write circuit 210, and the sense amplifiers 214 according to control signals CTRL. The control signals CTRL may include one or more of an indication to perform a read operation, an indication to perform a write operation, and the like.

The controller 202 may include one or more of a clock circuit, a clock recovery circuit, a sequencer, a state machine circuit, command decoding logic, and the like. A person of ordinary skill in the art in light of the teachings and disclosures herein would be aware of a variety of circuits and processes for implementing the controller 202.

The bitline conditioning circuit 204 is configured to pull up, pull down, or float a plurality of bitline groups 222 according to control signals received from the controller 202. Each bitline group 222 is associated with a column of the cell array 208.

In an embodiment, a bitline group 222 includes a pair of bitlines used for both reading values from and writing values into the cell array 208. In another embodiment, the bitline group 222 includes a pair of write bitlines used for writing values into the cell array 208 and a separate pair of read bitlines used for reading values from the cell array 208. In another embodiment, the bitline group 222 includes a pair of write bitlines used for writing values into the cell array 208 and a separate read bitline used for reading values from the cell array 208.

In an embodiment, a bitline group 222 includes one or more bitline control signals, that is, control signals that control operations of the memory cells associated with the bitline group 222. For example, the bitline group 222 may include bitline read control signals that control whether memory cells associated with the bitline group 222 are read.

The address decoder 206 is configured to generate signals on one or more of a plurality of word lines 2-224 and generate a plurality of column select signals 216 according to control signals received from the controller 202 and the address signals ADDR. Each word line 2-224 is associated with a row of the cell array 208.

In an embodiment, one of the word lines 2-224 is associated with each row of the cell array 208. In another embodiment, a pair of the word lines 2-224 is associated with each row of the cell array 208. The pair of the word lines 2-224 may include a read word line and a write word line.

The cell array 208 includes a plurality of memory cells 2-220. Each of the plurality of memory cells 2-220 is disposed at a respective intersection of a row of the memory array 208 and a column of the memory array 208.

The memory cells 2-220 are configured to store and provide respective information according to values of the one or more word lines 2-224 of the respective rows and values of the bitline group 222 of the respective columns.

The write circuit 210 is configured to generate signals on the bitline groups 222 according to control signals received from the controller 202 and values received using the data in signals DIN. In an embodiment wherein the bitline group 222 includes one or more write bitlines, the write circuit 210 is configured to control values of the write bitlines.

Each of the column muxes 212 is configured to select, according to the column select signals 216, one bitline group 222 of a plurality of bitline groups 222 and couple the selected bitline group 222 to a respective one of the sense amplifiers 214. In an embodiment, each column mux 212 selects one of two, four, or eight bitline groups 222.

Embodiments of the SRAM 2-110 may not include the column muxes 212, and may instead couple each of the bitline groups 222 to a respective one of the sense amplifiers 214.

The sense amplifiers 214 are configured to generate values of the data out signals DOUT according to control signals received from the controller 202 and values of the respective selected bitline groups 222.

A person of ordinary skill in the art in light of the teachings and disclosures herein would understand how to implement, without undue experimentation, the controller 202, bitline conditioning circuit 204, address decoder 206, write circuit 210, column muxes 212, and sense amplifiers 214 of the SRAM 2-110.

Figure 3:
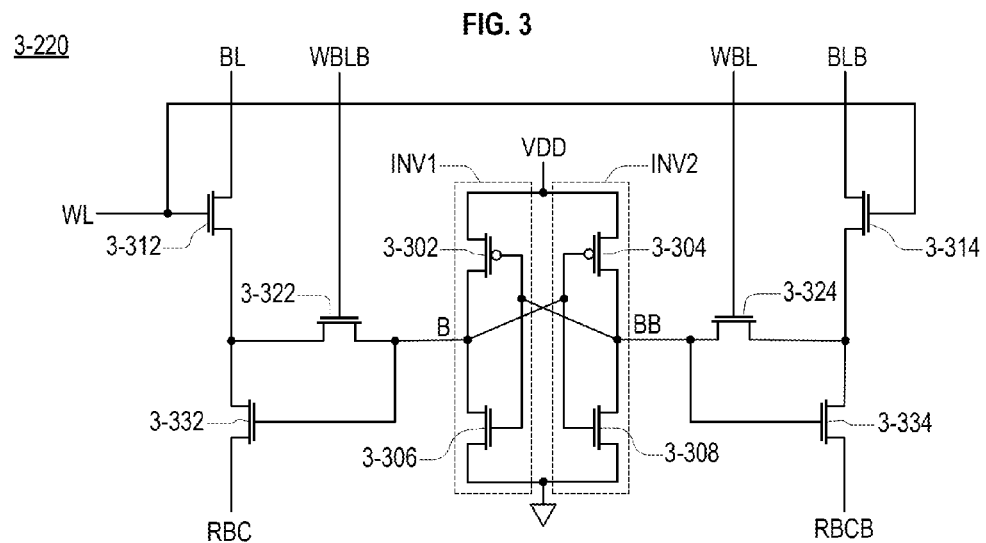
FIG. 3 is a diagram of a memory cell circuit according to an embodiment.

FIG. 3 illustrates a memory cell (that is, a memory cell circuit) 3-220 according to an embodiment. The memory cell 3-220 is a disturb-proof memory cell 3-220 suitable for use in memory cells 2-220 of the SRAM 2-110 of FIG. 2.

The memory cell 3-220 is coupled to a bitline group. The bitline group includes a bitline BL, a bitline-bar BLB, a write bitline WBL, a write-bar bitline WBLB, a read control bitline RBC, and a read control bar bitline RBCB. The bitline group may be a bitline group 222 of the SRAM 2-110 of FIG. 2.

The memory cell 3-220 is coupled to a word line WL. The word line WL may be a word line 2-224 of the SRAM 2-110 of FIG. 2.

The memory cell 3-220 includes first and second upper latch transistors 3-302 and 3-304, first and second lower latch transistors 3-306 and 3-308, first and second select transistors 3-312 and 3-314, first and second write transistors 3-322 and 3-324, and first and second read buffer transistors 3-332 and 3-334. In an embodiment, the upper latch transistors 3-302 and 3-304 include pMOSFETs, and the lower latch transistors 3-306 and 3-308, select transistors 3-312 and 3-314, write transistors 3-322 and 3-324, and read buffer transistors 3-332 and 3-334 include nMOSFETs, but embodiments are not limited thereto.

Each of the transistors of the memory cell 3-220 includes a control terminal (for example, a gate terminal) and first and second conduction terminals (for example, source and drain terminals). Each transistor is turned on or off according to a voltage value on the respective control terminal. When each transistor is turned on, current is permitted to flow between the respective first and second conduction terminals. When each transistor is turned off, current flow between the respective first and second conduction terminals is blocked.

The upper and lower latch transistors 3-302 to 3-308 are configured as cross-coupled first and second inverters INV1 and INV2. The first inverter INV1 includes the first upper and first lower latch transistors 3-302 and 3-306. The second inverter INV2 includes the second upper and second lower latch transistors 3-304 and 3-308. The first and second inverters INV1 and INV2 are configured to operate together as a latch circuit.

First conduction terminals of the upper latch transistors 3-302 and 3-304 are coupled to a supply voltage VDD. Second conduction terminals of the first and second upper latch transistors 3-302 and 3-304 are coupled to a bit node B and a bit-bar node BB, respectively. Gate terminals of the first and second upper latch transistors 3-302 and 3-304 are coupled to the bit-bar node BB and the bit node B, respectively.

First conduction terminals of the lower latch transistors 3-306 and 3-308 are coupled to a ground voltage represented by an inverted triangle. Second conduction terminals of the first and second lower latch transistors 3-306 and 3-308 are coupled to the bit node B and the bit-bar node BB, respectively. Gate terminals of the first and second lower latch transistors 3-306 and 3-308 are coupled to the bit-bar node BB and the bit node B, respectively.

Second conduction terminals of the first and second select transistors 3-312 and 3-314 are coupled to the bitline BL and the bitline-bar BLB, respectively. Gate terminals of the select transistors 3-312 and 3-314 are coupled to the word line WL.

First conduction terminals of the first and second select transistors 3-312 and 3-314 are coupled to second conduction terminals of the first and second write transistors 3-322 and 3-324 and to second conduction terminals of the first and second read buffer transistors 3-332 and 3-334, respectively.

Gate terminals of the first and second write transistors 3-322 and 3-324 are coupled to the write-bar bitline WBLB and the write bitline WBL, respectively. First conduction terminals of the first and second write transistors 3-322 and 3-324 are coupled to the bit node B and the bit-bar node BB, respectively.

Gate terminals of the first and second read buffer transistors 3-332 and 3-334 are coupled to the bit node B and the bit-bar node BB, respectively. Second conduction terminals of the first and second read buffer transistors 3-332 and 3-334 are coupled to the first conduction terminals of the first and second select transistors 3-312 and 3-314, respectively. First conduction terminals of the first and second read buffer transistors 3-332 and 3-334 are coupled to the read control bitline RBC and the read control bar bitline RBCB, respectively.

Figure 4:
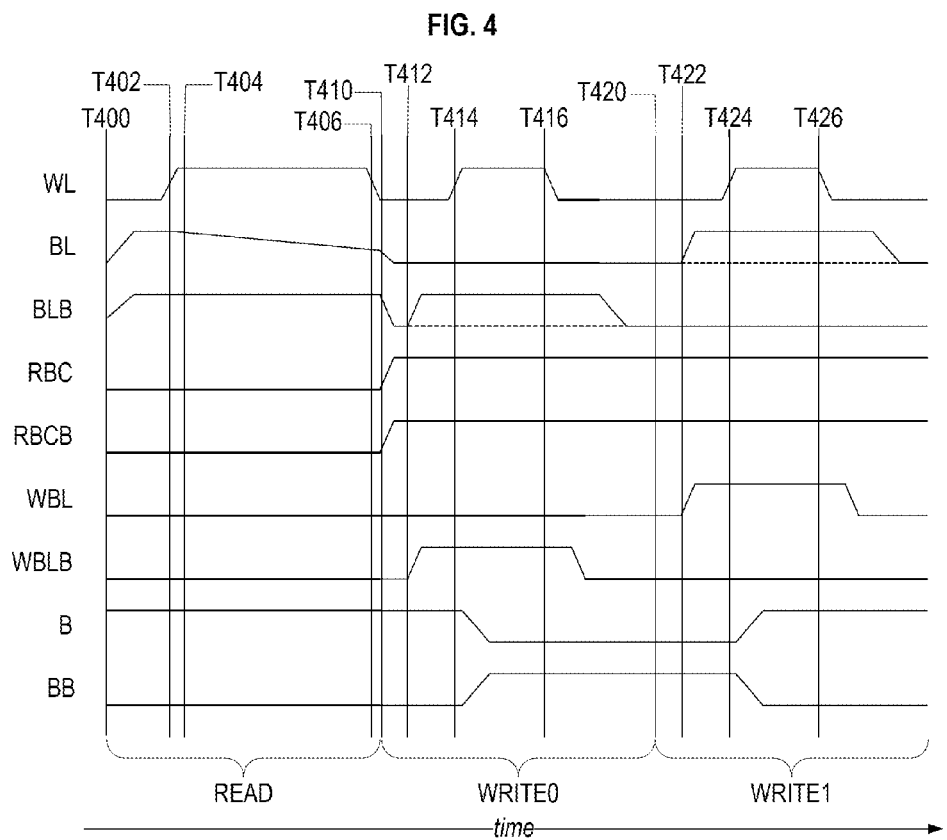
FIG. 4 illustrates operations of the memory cell circuit of FIG. 3 according to an embodiment.

FIG. 4 illustrates operations of the memory cell 3-220 according to an embodiment. FIG. 4 illustrates a read operation READ, a first write operation WRITE0, and a second write operation WRITE1.

FIG. 4 shows an illustrative read operation READ wherein the bit node B has a high value and the bit-bar node BB has a low value. A person of ordinary skill in the art based on the teachings and disclosures herein would understand that the memory cell 3-220 operates in a similar but symmetric fashion when the bit node B has a low value and the bit-bar node BB has a high value.

The read operation READ begins at a first time T400. During the read operation READ, the write bitline WBL, the write-bar bitline WBLB, the read control bitline RBC, and the read control bar bitline RBCB have a low value. Because the write bitline WBL and the write-bar bitline WBLB have a low value, the second and first write transistors 3-324 and 3-322, respectively, remain off during the read operation READ.

At the first time T400, the word line WL has a low value. The bitline BL and the bitline-bar BLB are precharged to a high value. Precharging the bitline BL and the bitline-bar BLB may be performed by a circuit such as the bitline conditioning circuit 204 of the SRAM 2-110 of FIG. 2.

After the bitline BL and the bitline-bar BLB are precharged, at a second time T402 the word line WL is driven to a high value. The word line WL having a high value causes the select transistors 3-312 and 3-314 to turn on.

When the select transistors 3-312 and 3-314 are turned on, at a third time T404 one of the bitline BL and the bitline-bar BLB will be pulled down according to the values of the bit node B and the bit-bar node BB.

When the bit node B has a high value, the high value of the bit node B turns on the first read buffer transistor 3-332. The first read buffer transistor 3-332 and the first select transistor 3-312 then couple the read control bitline RBC to the bitline BL. Because the read control bitline RBC has a low value, the bitline BL is pulled down and the voltage value on the bitline BL begins to decrease.

At the same time, the bit-bar node BB has a low value, and the low value of the bit-bar node BB turns off the second read buffer transistor 3-334. As a result, a voltage value of the bitline-bar BLB is not pulled down and therefore remains substantially the same.

The bit node B and bit-bar node BB affect the values of the bitline BL and the bitline-bar BLB by controlling the first and second read buffer transistors 3-332 and 3-334, respectively. As a result, during the read operation READ, the bit node B and bit-bar node BB are not exposed to electrical charges stored in capacitances of the bitline BL and the bitline-bar BLB, respectively. This lack of exposure prevents a disturbance of the voltage values of the bit node B and bit-bar node BB by the electrical charges present on the bitline BL and the bitline-bar BLB.

Subsequent to the third time T404, a sense amplifier, such as the sense amplifier 214 of FIG. 2, uses the difference between the values of the bitline BL and the bitline-bar BLB to determine the value stored in the memory cell 3-220.

At a fourth time T406, the word line WL is driven to a low value, the select transistors 3-312 and 3-314 are turned off, and the read operation READ ends.

The first write operation WRITE0 begins at a fifth time T410. The first write operation WRITE0 operates to stores a value of "0" into the memory cell 3-220, that is, the bit node B has a low voltage value and the bit-bar node BB has a high voltage value when the first write operation WRITE0 is complete.

During the first write operation WRITE0, the read control bitline RBC and the read control bar bitline RBCB are driven to and maintained at a high voltage value. The high voltage value is configured to keep the read buffer transistors 3-332 and 3-334 turned off regardless of the voltage values of the bit node B and the bit-bar node BB.

At the fifth time T410, the word line WL, the write bitline WBL, and the write-bar bitline WBLB each have a low value.

At the sixth time T412, one of the write bitline WBL and the write-bar bitline WBLB is selected according to the value being stored into the memory cell 3-220. The selected write bitline is driven to a high voltage value. In the first write operation WRITE0, the value being written is "0," and as a result the write-bar bitline WBLB is selected and driven to the high voltage value.

The write-bar bitline WBLB having the high value causes the first write transistor 3-322 to turn on. The write bitline WBL having the low value keeps the second write transistor 3-324 turned off.

In an embodiment, one of the bitline BL and the bitline-bar BLB is selected according to the value being stored into the memory cell 3-220. The selected bitline is then driven to a high voltage value, and the unselected bitline is maintained at a low voltage value. In the first write operation WRITE0, the value being written is "0," and as a result the bitline-bar BLB is selected and driven to the high voltage value, and the bitline BL is maintained at the low voltage value.

In another embodiment, the bitline BL and the bitline-bar BLB are both maintained at a low voltage value throughout the first write operation WRITE0.

At a seventh time T414, the word line WL is driven to a high voltage value. The high voltage value of the world line WL turns on the select transistors 3-312 and 3-314.

Because the first select transistors 3-312 and the first write transistor 3-322 are both turned on, the bitline BL is coupled to the bit node B and the voltage value of the bit node B is pulled down. As the voltage value of the bit node B decreases, a value of an output voltage of the second inverter INV2 increases. A person of ordinary skill in the art in light of the teachings and disclosure herein would understand that a positive feedback then operates to produce and maintain a low voltage value on the bit node B and a high voltage value on the bit-bar node BB.

At an eighth time T416, the word line WL is driven to a low voltage value. The low voltage value of the world line WL turns off the select transistors 3-312 and 3-314, and the first write operation WRITE0 ends.

The second write operation WRITE1 begins at a ninth time T420. The second write operation WRITE1 operates to stores a value of "1" into the memory cell 3-220, that is, the second write operation WRITE1 causes the bit node B to have a high voltage value and the bit-bar node BB to have a low voltage value. The second write operation WRITE1 differs from the first operation WRITE0 according to the difference in the value being stored into the memory cell 3-220.

Accordingly, at the tenth time T422, because a "1" is being stored instead of a "0", the write bitline WBL is selected and driven high instead of the write-bar bitline WBLB, and in an embodiment wherein one of the bitline BL and the bitline-bar BLB is selected to be driven high, it is the bitline BL instead of the bitline-bar BLB.

In an embodiment wherein some columns of a row are not selected to be written to, write bitlines WBL and write-bar bitlines WBLB of the unselected columns are maintained at low voltage values during the first and second write operations WRITE0 and WRITE1. The low voltage values of the write bitlines WBL and write-bar bitlines WBLB of the unselected columns turn off the corresponding write transistors 3-322 and 3-324 of the memory cells 3-220 of the unselected columns, which protects the memory cells 3-220 of the unselected columns from being disturbed during the first and second write operations WRITE0 and WRITE1.

In an embodiment where data masking is performed, a memory cell 3-220 has corresponding write bitlines WBL and write-bar bitlines WBLB maintained at low voltage values during writes when data masking is enabled for a bit associated with the memory cell 3-220, which protects the memory cell 3-220 from being disturbed during the first and second write operations WRITE0 and WRITE1.

Figure 5:
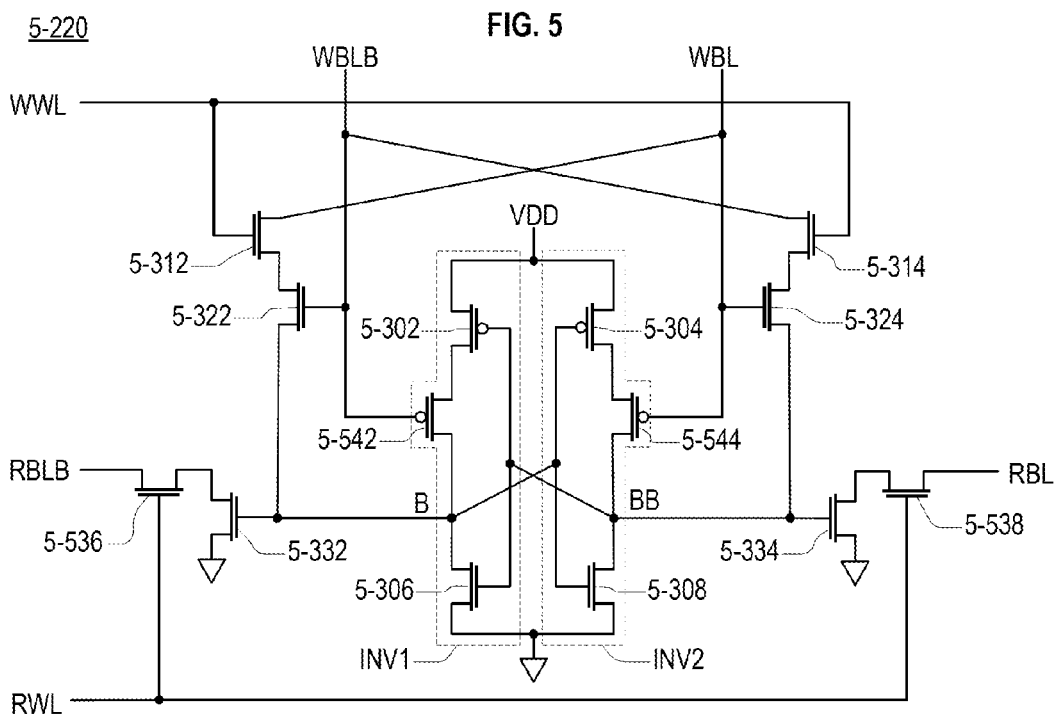
FIG. 5 is a diagram of a memory cell circuit according to another embodiment.

FIG. 5 illustrates a memory cell 5-220 according to another embodiment. The memory cell 5-220 is a disturb-proof non-fighting memory cell 5-220 suitable for use in memory cells 2-220 of the SRAM 2-110 of FIG. 2.

The memory cell 5-220 is coupled to a bitline group. The bitline group includes a read bitline RBL, a read bitline-bar RBLB, a write bitline WBL, and a write-bar bitline WBLB. The bitline group may be a bitline group 222 of the SRAM 2-110 of FIG. 2.

The memory cell 5-220 is coupled to a write word line WWL and a read word line RWL. The write word line WWL and the read word line RWL may be included in a word line 2-224 of the SRAM 2-110 of FIG. 2.

The memory cell 5-220 includes first and second upper latch transistors 5-302 and 5-304, first and second lower latch transistors 5-306 and 5-308, first and second write transistors 5-322 and 5-324, and first and second read buffer transistors 5-332 and 5-334. The memory cell 5-220 includes further includes first and second write select transistors 5-312 and 5-314, first and second read select transistors 5-536 and 5-538, and first and second enable transistors 5-542 and 5-544.

In an embodiment, the upper latch transistors 5-302 and 5-304 and the enable transistors 5-542 and 5-544 include pMOSFETs, and the lower latch transistors 5-306 and 5-308, write select transistors 5-312 and 5-314, write transistors 5-322 and 5-324, read buffer transistors 5-332 and 5-334, and read select transistors 5-536 and 5-538 include nMOSFETs, but embodiments are not limited thereto.

The upper and lower latch transistors 5-302 to 5-308 and the enable transistors 5-542 and 5-544 are configured as cross-coupled first and second inverters INV1 and INV2. The first inverter INV1 includes the first upper and first lower latch transistors 5-302 and 5-306 and the first enable transistor 5-542. The second inverter INV2 includes the second upper and second lower latch transistors 5-304 and 5-308 and the second enable transistor 5-544. The first and second inverters INV1 and INV2 are configured to operate together as a latch circuit.

First conduction terminals of the upper latch transistors 5-302 and 5-304 are coupled to a supply voltage VDD. Second conduction terminals of the first and second upper latch transistors 5-302 and 5-304 are coupled to first conduction terminals of the first and second enable transistors 5-542 and 5-544, respectively. Second conduction terminals of the first and second enable transistors 5-542 and 5-544 are coupled to a bit node B and a bit-bar node BB, respectively. Gate terminals of the first and second upper latch transistors 5-302 and 5-304 are coupled to the bit-bar node BB and the bit node B, respectively.

First conduction terminals of the lower latch transistors 5-306 and 5-308 are coupled to a ground voltage represented by an inverted triangle. Second conduction terminals of the first and second lower latch transistors 5-306 and 5-308 are coupled to the bit node B and the bit-bar node BB, respectively. Gate terminals of the first and second lower latch transistors 5-306 and 5-308 are coupled to the bit-bar node BB and the bit node B, respectively.

When a gate terminal of the first enable transistor 5-542 has a low voltage value, the first enable transistor 5-542 is turned on and the first inverter INV1 is configured to increase or decrease a voltage value of the bit node B according to a voltage value of the bit-bar node BB. When the gate terminal of the first enable transistor 5-542 has a high voltage value, the first enable transistor 5-542 is turned off and the first inverter INV1 is configured to decrease the voltage value of the bit node B but is not configured to increase the voltage value of the bit node B.

When a gate terminal of the second enable transistor 5-544 has a low voltage value, the second enable transistor 5-544 is turned on and the second inverter INV2 is configured to increase or decrease a voltage value of the bit-bar node BB according to a voltage value of the bit node B. When the gate terminal of the second enable transistor 5-544 has a high voltage value, the second enable transistor 5-544 is turned off and the second inverter INV2 is configured to decrease the voltage value of the bit-bar node BB but is not configured to increase the voltage value of the bit-bar node BB.

Gate terminals of the select transistors 5-312 and 5-314 are coupled to the write word line WWL. First conduction terminals of the first and second write select transistors 5-312 and 5-314 are coupled to second conduction terminals of the first and second write transistors 5-322 and 5-324, respectively.

First conduction terminals of the first and second write transistors 5-322 and 5-324 are coupled to the bit node B and the bit-bar node BB, respectively. Gate terminals of the first and second write transistors 5-322 and 5-324 are coupled to the write-bar bitline WBLB and the write bitline WBL, respectively.

The gate terminals of the first and second enable transistors 5-542 and 5-544 are also coupled to the write-bar bitline WBLB and the write bitline WBL, respectively.

Second conduction terminals of the first and second write select transistors 5-312 and 5-314 are couples, through cross-over connections, to the write bitline WBL and the write-bar bitline WBLB, respectively.

Gate terminals of the first and second read buffer transistors 5-332 and 5-334 are coupled to the bit node B and the bit-bar node BB, respectively. Second conduction terminals of the first and second read buffer transistors 5-332 and 5-334 are coupled to first conduction terminals of the first and second read select transistors 5-536 and 5-538, respectively. First conduction terminals of the first and second read buffer transistors 5-332 and 5-334 are coupled to the ground voltage.

Second conduction terminals of the first and second read select transistors 5-536 and 5-538 are coupled to the read bitline-bar RBLB and the read bitline RBL, respectively. Gate terminals of the first and second read select transistors 5-536 and 5-538 are coupled to the read word line RWL.

Figure 6:
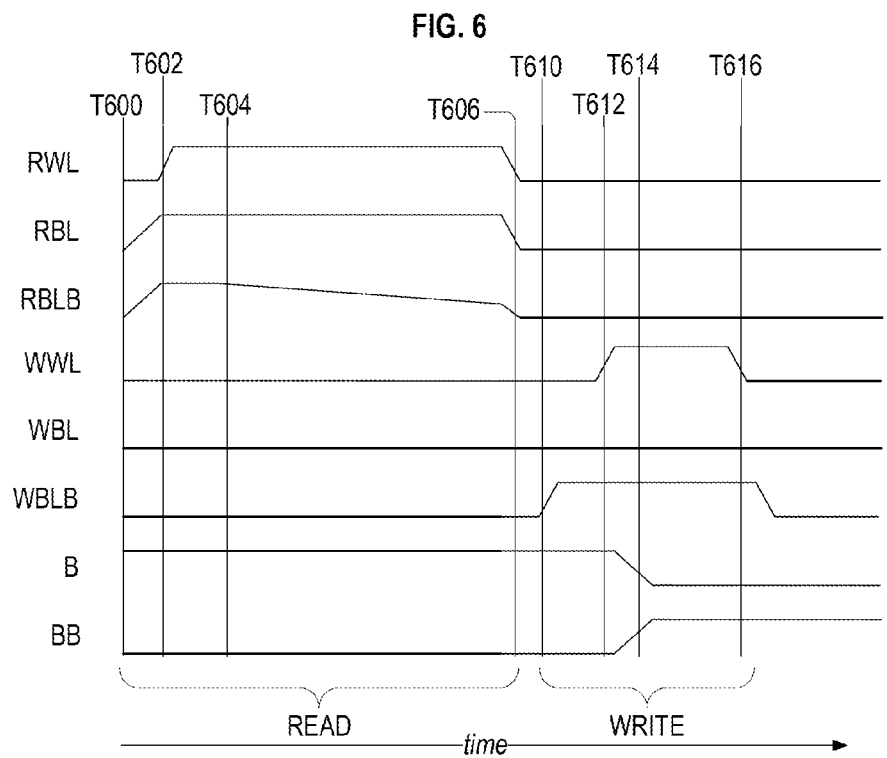
FIG. 6 illustrates operations of the memory cell circuit of FIG. 5 according to an embodiment.

FIG. 6 illustrates operations of the memory cell 5-220 according to an embodiment. FIG. 6 illustrates a read operation READ, and a write operation WRITE.

FIG. 6 shows an illustrative read operation READ wherein the bit node B has a high voltage value and the bit-bar node BB has a low voltage value, and an illustrative write operation WRITE that results in the bit node B having a low voltage value and the bit-bar node BB having a high voltage value. A person of ordinary skill in the art based on the teachings and disclosures herein would understand that the memory cell 5-220 operates in a similar but symmetric fashion when a read operation is performed and the bit node B has a low value and the bit-bar node BB has a high value, or when a write operation results in the bit node B having a high voltage value and the bit-bar node BB having a low voltage value.

The read operation READ begins at a first time T600. During the read operation READ, the write bitline WBL, the write-bar bitline WBLB, and the write word line WWL have a low value. As a result, the write transistors 5-322 and 5-324 and the write select transistors 5-312 and 5-314 remain off during the read operation READ, and the enable transistors 5-542 and 5-544 remain on.

At the first time T600, the read word line RWL has a low value. The read bitline RBL and the read bitline-bar RBLB are precharged to a high value.

After the read bitline RBL and the read bitline-bar RBLB are precharged, at a second time T602 the read word line RWL is driven to a high value. The read word line RWL having a high value causes the read select transistors 5-536 and 5-538 to turn on.

When the read select transistors 5-536 and 5-538 are turned on, at a third time T604 one of the read bitline RBL and the read bitline-bar RBLB will be pulled down according to the values of the bit node B and the bit-bar node BB.

Specifically, the high value of the bit node B turns on the first read buffer transistors 5-332. The first read buffer transistors 5-332 and the first read select transistors 5-536 being on couples the read bitline-bar RBLB to the ground voltage, and as a result the read bitline-bar RBLB is pulled down and the voltage value on the read bitline-bar RBLB begins to decrease.

At the same time, the low value of the bit-bar node BB turns off the second read buffer transistors 5-334. As a result, a voltage value of the bitline BLB is not pulled down and therefore remains substantially the same.

The bit node B and bit-bar node BB affect the values of the read bitline RBL and the read bitline-bar RBLB by controlling the first and second read buffer transistors 5-332 and 5-334, respectively. As a result, the bit node B and bit-bar node BB are not exposed to charges present on the read bitline RBL and the read bitline-bar RBLB, respectively, during the read operation READ. This lack of exposure prevents a disturbance of the voltage values of the bit node B and bit-bar node BB by the charges of the read bitline RBL and the read bitline-bar RBLB.

Subsequent to the third time T604, a sense amplifier, such as the sense amplifier 214 of FIG. 2, uses a difference between the values of the read bitline RBL and the read bitline-bar RBLB to determine the value stored in the memory cell 3-220.

At a fourth time T606, the read word line RWL is driven to a low value, the read select transistors 5-536 and 5-538 are turned off, and the read operation READ ends.

The write operation WRITE begins at a fifth time T610. The write operation WRITE operates to stores a value of "0" into the memory cell 5-220, that is, the bit node B has a low voltage value and the bit-bar node BB has a high voltage value when the write operation WRITE is complete.

During the write operation WRITE, the read word line RWL is maintained at a low voltage value, turning off the read select transistors 5-536 and 5-538. The read bitline RBL and the read bitline-bar RBLB may be at high or low voltage values according to embodiments.

At the fifth time T610, the read word line RWL has a low voltage value, and voltage values of the write bitline WBL and the write-bar bitline WBLB are determined according to the value being stored. In the example illustrated in FIG. 6 where a '0' is being stored, the write bitline WBL is driven to a low voltage value and the write-bar bitline WBLB is driven to a high voltage value.

The write-bar bitline WBLB having the high value causes the first write transistor 5-322 to turn on and the first enable transistor 5-542 to turn off Because the first enable transistor 5-542 is off, the first inverter INV1 is not capable of causing an increase, or preventing a decrease, in a voltage value of the bit node B.

The write bitline WBL having the low value keeps the second write transistor 5-324 turned off and the second enable transistor 5-544 turned on. As a result, the second inverter INV2 is capable of increasing or decreasing a voltage value of the bit-bar node BB according to the voltage value of the bit node B.

At a sixth time 1612, the write word line WWL is driven to a high voltage value. The high voltage value of the write world line WWL turns on the write select transistors 5-312 and 5-314.

Because the first write select transistors 5-312 and the first write transistor 5-322 are both turned on, the write bitline WBL is coupled to the bit node B and the voltage value of the bit node B is pulled down. Because the first enable transistor 5-542 is turned off, the first inverter INV1 does not fight the pulling down of the voltage value of the bit node B.

As a result of the voltage value of the bit node B decreasing, a value of an output voltage of the second inverter INV2 increases. A person of ordinary skill in the art in light of the teachings and disclosure herein would understand that a positive feedback then operates to produce and maintain a low voltage value on the bit node B and a high voltage value on the bit-bar node BB.

At a seventh time T616, the write word line WWL is driven to a low voltage value, and at the seventh time T616 or subsequently thereto the write-bar bitline WBLB is also driven to a low voltage value. The low voltage value of the write word line WWL turns off the write select transistors 5-312 and 5-314, and the write operation WRITE ends.

Figure 7:
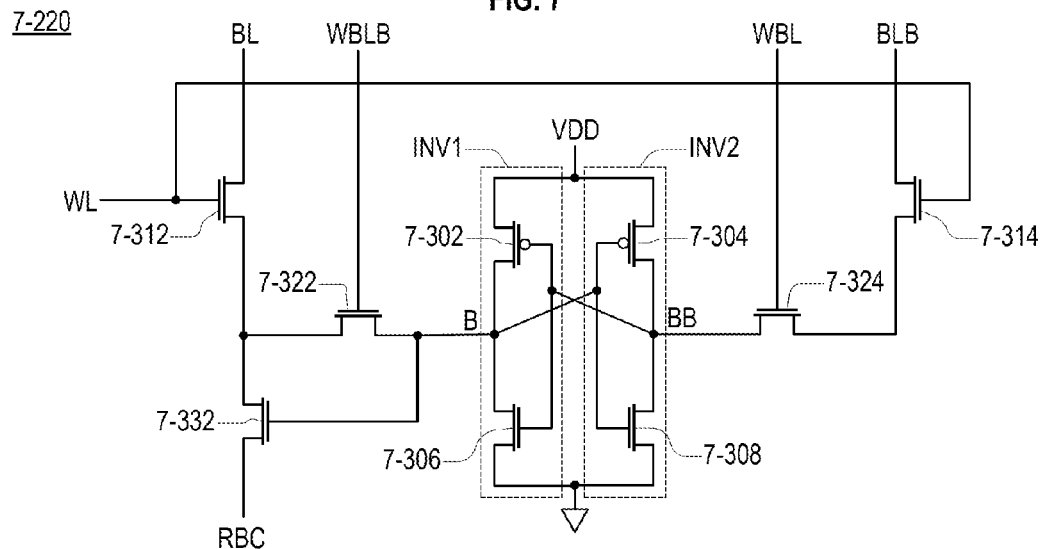
FIG. 7 is a diagram of a memory cell circuit according to another embodiment.

FIG. 7 illustrates a memory cell 7-220 according to another embodiment. The memory cell 7-220 is a disturb-proof single-ended memory cell 7-220 suitable for use as one or more of the memory cells 2-220 of the SRAM 2-110 of FIG. 2.

The memory cell 7-220 differs from the memory cell 3-220 of FIG. 3 by the absence of a read control bar bitline RBCB and a second read buffer transistor 3-334.

Read operations of the memory cell 7-220 are, with one exception, substantially identical to the corresponding write operations of the memory cell 3-220 of FIG. 3. The exception occurs at a time corresponding to the third time T404 of FIG. 4.

At a time corresponding to the third time T404, a read operation of the memory cell 7-220 will pull down a voltage value of the bitline BL when the bit node B has a high voltage value, will leave the voltage value of the bitline BL at the precharged high voltage value when the bit node B has a low voltage value. The memory cell 7-220 will leave the voltage value of the bitline-bar BLB at the precharged high voltage value regardless of the voltage value of the bit-bar node BB.

A person of ordinary skill in the art would understand how to implement a sense amplifier configured to determine a stored value within the memory cell 7-220 according to a voltage value of the bitline BL.

Write operations of the memory cell 7-220 are substantially identical to the corresponding write operations of the memory cell 3-220 of FIG. 3.

Figure 8:
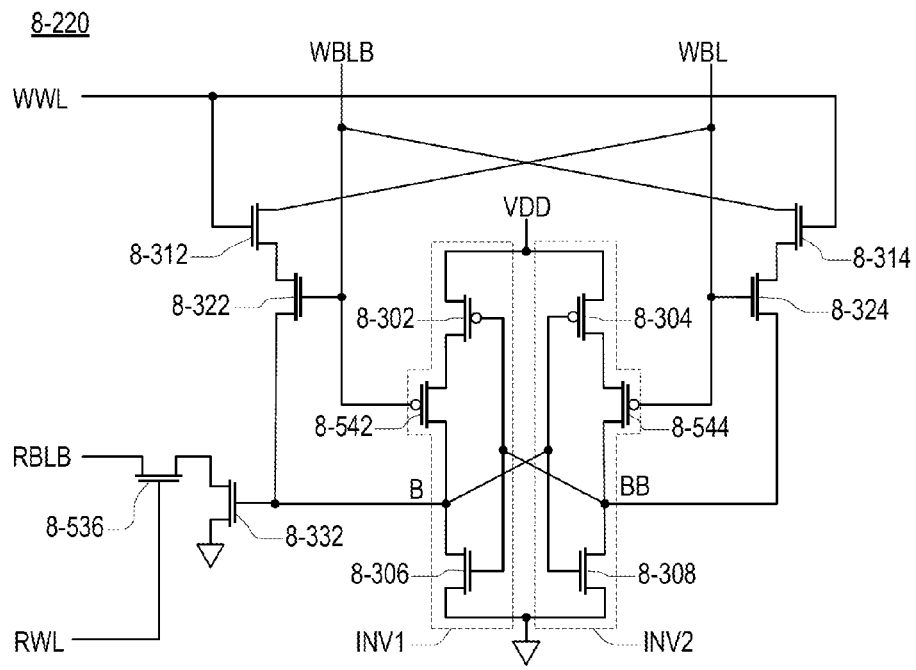
FIG. 8 is a diagram of a memory cell circuit according to another embodiment.

FIG. 8 illustrates a memory cell 8-220 according to another embodiment. The memory cell 8-220 is a disturb-proof non-fighting single-ended memory cell suitable for use as one of the memory cells 2-220 of the SRAM 2-110 of FIG. 2.

The memory cell 8-220 differs from the memory cell 5-220 of FIG. 5 by the absence of a read bitline RBL, a second read select transistor 5-583, and a second read buffer transistor 5-334. As a result, at a time corresponding to the third time T604 of FIG. 6, a read operation of the memory cell 8-220 will pull down a voltage value of the read bitline-bar RBLB when the bit node B has a high voltage value, and will leave the voltage value of the read bitline-bar RBLB at the precharged high voltage value when the bit node B has a low voltage value.

A person of ordinary skill in the art would understand how to implement a sense amplifier configured to determine a stored value within the memory cell 8-220 according to a voltage value of the read bitline-bar RBLB.

Write operations of the memory cell 8-220 are substantially identical to the corresponding write operations of the memory cell 5-220 of FIG. 5.

FIG. 9 illustrates a process 900 of operating a memory cell according to an embodiment. The process 900 may be employed in, for example, the SRAM 2-110 of FIG. 2.

At S902, whether a column including the memory cell is selected is determined. When the column is not selected, the process proceeds to S910.

At S904, whether a bit associated with the memory cell is bit-masked is determined. When the bit is bit-masked, the process proceeds to S910.

At S906, whether a read operation is to be performed is determined. When a read operation is to be performed, the process proceeds to S910.

At S910, a first value is provided on each of first and second write bitlines coupled to the memory cell. The first value being provided on the first and second write bitlines causes one or more write transistors of the memory cell to be off. In an embodiment, the first value being provided on the first and second write bitlines causes one or more enable transistors of the memory cell to be on. The one or more enable transistors may be enable transistors in a latch circuit of the memory cell.

In an embodiment, at S910 a read control bitline coupled to the memory cell may be driven to a first read control value when the read operation is to be performed, and driven to a second read control value otherwise.

At S908, a value to be stored into the memory cell is determined.

At S912, a first value is provided on the first write bitline and a second value is provided on the second write bitline when a first storable value is to be stored in the memory cell.

At S914, the second value is provided on the first write bitline and the first value is provided on the second write bitline when a second storable value is to be stored in the memory cell.

In an embodiment, at either of S912 or S914 the read control bitline is driven to the second read control value.

At S920, a word line is asserted to cause the read or write operation to occur. In an embodiment, a write word line is asserted when a write operation is performed and a read word line is asserted when a read operation is performed.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A circuit comprising:
   a latch circuit;
   a buffer transistor having a control terminal coupled to a first output of the latch;
   a first write transistor having a conduction terminal coupled to the first output of the latch and a control terminal coupled to a first write bitline; and
   a second write transistor having a conduction terminal coupled to a second output of the latch and a control terminal coupled to a second write bitline,
   wherein the latch circuit includes:
      a first inverter having an input coupled to the first output of the latch and an output coupled to the second output of the latch; and
      a second inverter having an input coupled to the second output of the latch and an output coupled to the first output of the latch,
   wherein the first inverter includes an enable transistor,
   wherein a control terminal of the enable transistor is coupled to the first write bitline, and
   wherein the enable transistor is configured to prevent the first inverter from increasing a voltage value of the second output of the latch when the enable transistor is off.

2. The circuit of claim 1, wherein the enable transistor is a first enable transistor,
   wherein the second inverter includes a second enable transistor,
   wherein a control terminal of the second enable transistor is coupled to the second write bitline, and
   wherein the second enable transistor is configured to prevent the second inverter from increasing a voltage value of the first output of the latch when the second enable transistor is off.

3. The circuit of claim 1, wherein the buffer transistor is a first buffer transistor, and further comprising:
   a second buffer transistor having a control terminal coupled to the second output of the latch.

4. The circuit of claim 1, wherein a conduction terminal of the buffer transistor is coupled to a read control bitline.

5. The circuit of claim 1, wherein a conduction terminal of the buffer transistor is coupled to a ground voltage.

6. The circuit of claim 1, further comprising:
   a select transistor having a control terminal coupled to a word line, a first conduction terminal coupled to a conduction terminal of the buffer transistor, and a second conduction terminal coupled to a bitline.

7. The circuit of claim 1, wherein the conduction terminals of the first and second write transistors are first conduction terminals, and further comprising:
   first and second write select transistors,
   wherein control terminals of the first and second write select transistors are coupled to a write word line,
   wherein a first conduction terminal of the first write select transistor is coupled to a second conduction terminal of the first write transistor,
   wherein a second conduction terminal of the first write select transistor is coupled to the second write bitline,
   wherein a first conduction terminal of the second write select transistor is coupled to a second conduction terminal of the second write transistor, and
   wherein a second conduction terminal of the second write select transistor is coupled to the first write bitline.

8. The circuit of claim 1, wherein the buffer transistor is a first buffer transistor, and further comprising:
   a second buffer transistor having a control terminal coupled to the second output of the latch.

9. The circuit of claim 1, wherein the buffer transistor and the first and second write transistors each include a Metal-Oxide-Semiconductor Field Effect Transistor (MOSFET).

10. The circuit of claim 1, wherein the circuit is provided in an integrated circuit.

11. A method of operating a memory cell circuit, the method comprising:
   providing a first value on first and second write bitlines coupled to the memory cell circuit when a read operation is performed;
   providing the first value on the first write bitline and a second value on the second write bitline when a write operation is performed and a value to be stored into the memory cell circuit has a first storable value; and
   providing the second value on the first write bitline and the first value on the second write bitline when the write operation is performed and the value to be stored into the memory cell circuit has a second storable value,
   wherein the first write bitline is coupled to a control terminal of a first write transistor of the memory cell circuit,
   wherein the second write bitline is coupled to a control terminal of a second write transistor of the memory cell circuit,
   wherein the first write bitline is coupled to a control terminal of a first enable transistor of the memory cell,
   wherein the second write bitline is coupled to a control terminal of a second enable transistor of the memory cell,
   wherein the first enable transistor is configured to prevent the latch from increasing a value of a first output of the latch when the first enable transistor is off, and
   wherein the second enable transistor is configured to prevent the latch from increasing a value of a second output of the latch when the second enable transistor is off.

12. The method of claim 11, further comprising:
   providing the first value on the first and second write bitlines when a column including the memory cell circuit is an unselected column.

13. The method of claim 11, further comprising:
providing the first value on the first and second write bitlines when a bit associated with the memory cell circuit is a masked bit.

14. The method of claim 11, further comprising:
determining a stored value of memory cell circuit using a read bitline,
wherein the read bitline is coupled to a conduction terminal of a buffer transistor of the memory cell circuit.

15. The method of claim 11, further comprising:
providing a first read control value on a read control bitline coupled to a conduction terminal of a buffer transistor of the memory cell circuit when the read operation is performed; and
providing a second read control value on the read control bitline when the write operation is performed.

16. A circuit comprising:
a latch circuit;
a buffer transistor having a control terminal coupled to a first output of the latch;
a first write transistor having a first conduction terminal coupled to the first output of the latch and a control terminal coupled to a first write bitline; and
a second write transistor having a first conduction terminal coupled to a second output of the latch and a control terminal coupled to a second write bitline,
first and second write select transistors,
wherein control terminals of the first and second write select transistors are coupled to a write word line,
wherein the first conduction terminal of the first write select transistor is coupled to a second conduction terminal of the first write transistor,
wherein a second conduction terminal of the first write select transistor is coupled to the second write bitline,
wherein the first conduction terminal of the second write select transistor is coupled to a second conduction terminal of the second write transistor, and
wherein a second conduction terminal of the second write select transistor is coupled to the first write bitline.

17. The circuit of claim 16, wherein the buffer transistor is a first buffer transistor, and further comprising:
a second buffer transistor having a control terminal coupled to the second output of the latch.

18. The circuit of claim 16, wherein a conduction terminal of the buffer transistor is coupled to a read control bitline.

19. The circuit of claim 16, further comprising:
a select transistor having a control terminal coupled to a word line, a first conduction terminal coupled to a conduction terminal of the buffer transistor, and a second conduction terminal coupled to a bitline.

20. The circuit of claim 16, wherein the buffer transistor is a first buffer transistor, and further comprising:
a second buffer transistor having a control terminal coupled to the second output of the latch.

* * * * *